United States Patent [19]

Plows

[11] Patent Number: 4,587,425
[45] Date of Patent: May 6, 1986

[54] ELECTRON BEAM APPARATUS AND ELECTRON COLLECTORS THEREFOR

[76] Inventor: Graham S. Plows, The Old Vicarage, Cowlinge, Suffolk, England

[21] Appl. No.: 595,569
[22] PCT Filed: Jul. 15, 1983
[86] PCT No.: PCT/GB83/00174
 § 371 Date: Mar. 6, 1984
 § 102(e) Date: Mar. 6, 1984
[87] PCT Pub. No.: WO84/00443
 PCT Pub. Date: Feb. 2, 1984

[30] Foreign Application Priority Data

Jul. 16, 1982 [GB] United Kingdom ............... 8220665

[51] Int. Cl.⁴ .......................................... H01J 49/48
[52] U.S. Cl. ................... 250/305; 250/310; 250/397
[58] Field of Search ........... 250/305, 310, 397, 492.2; 313/523, 524

[56] References Cited

U.S. PATENT DOCUMENTS 4,039,810 8/1977 Heritage ................. 250/492.2 X
4,438,332 3/1984 Lichtenegger ............... 250/397 X

FOREIGN PATENT DOCUMENTS 0014304 8/1980 European Pat. Off. .
7902963 10/1980 Netherlands .

OTHER PUBLICATIONS

Patent Abstracts of Japan, vol. 4, No. 185(E38), Dec. 19, 1980, see p. 667, JP, A, 55128242 Hitachi Seisakusho, Oct. 10, 1980.
Soviet Inventions Illustrated, vol. C12, Apr. 30, 1980, Derwent (London, GB) see Abstract No. C6586C/12, SU, A, 556583, Moscow Lomonosov University, Jul. 5, 1979.

Primary Examiner—Alfred E. Smith
Assistant Examiner—Jack I. Berman
Attorney, Agent, or Firm—Young & Thompson

[57] ABSTRACT

Electron beam apparatus includes a voltage measuring electron collector including solid electrodes with central apertures. The electrodes comprise a corrector electrode (63) maintained at zero volts, an extractor electrode (15) at about 5 kilovolts positive, a filter electrode (16) which has an internally tapered tubular central part (67), a mirror electrode (64) and a scintillator (17) in the annular space between the mirror electrode and the filter electrode.

12 Claims, 7 Drawing Figures

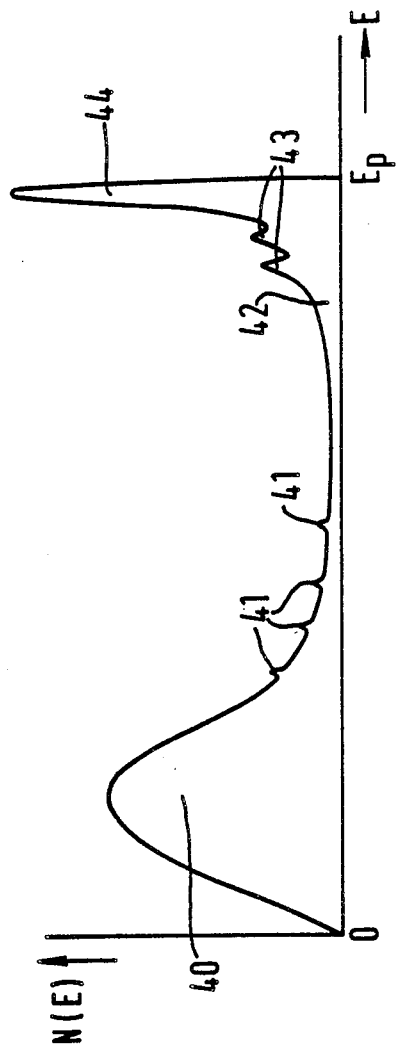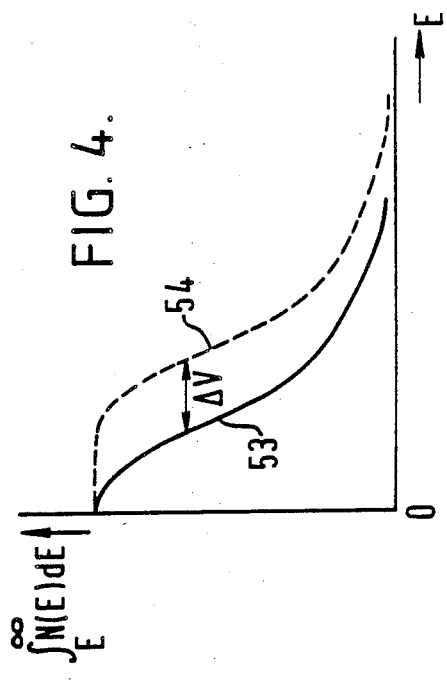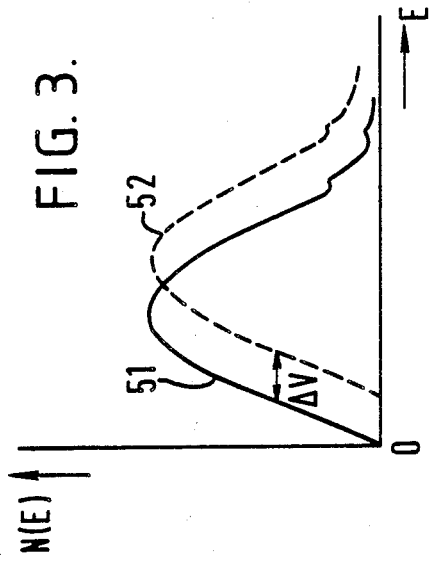

ELECTRON BEAM APPARATUS AND ELECTRON COLLECTORS THEREFOR

BACKGROUND OF THE INVENTION

This invention relates generally to electron beam apparatus of the kind in which an electron probe, constituted by a beam of electrons, is caused to impinge on a specimen under examination and information about, for example, the voltage distribution of the specimen surface is obtained by using a detector, including an electron collector, to pick up electrons emanating from the specimen.

Electron beam apparatus of the kind in which or for which the present invention may be used include general purpose scanning electron microscopes but also special purpose apparatus particularly adapted for inspection, quality control and fault diagnosis of integrated circuits.

It is generally known to employ an electron collector which collects secondary electrons emitted from the specimen, mainly as a function of the potential at the point on which the electron beam impinges, so as to develop an output signal which according to the mode of operation chosen for the electron beam apparatus can be used to derive, for example, a voltage contrast image or (particularly if stroboscopic scanning is used) information concerning the dynamic behaviour of the specimen under test. It is known to employ an electron collector which includes an extraction grid which may overcome field distortions above the surface of the specimen and also a control grid which can form a potential barrier of variable height to discriminate between secondary electrons emanating from regions of the specimen's surface of different potential. It is also known to employ a scintillator to collect the secondary electron current and to provide some discrimination between two secondary electrons emitted from the specimen and high energy reflected primary electrons.

SUMMARY OF THE INVENTION

It is the general object of the present invention to provide an improved electron collector or electron beam apparatus including such an improved collector. In particular the present invention concerns an improved system of electrodes which provide discrimination against the collection of unwanted high energy secondary electrons and also make the collection of electrons by or for a scintillator more efficient. As will be explained hereinafter, this aspect of the invention concerns the use of a solid reflective, or "mirror" electrode in combination with a filter electrode which is constituted by a cylindrical electrode of which the inner surface is of conical form. Further features of the voltage measuring electron collector characteristic of the present invention will be set forth hereinafter.

In a preferred form, the invention facilitates the scannng, or vector deflection, of the electron beam within an area up to 10 millimeters square or more on a normal specimen, depending on the working distance, that is to say the distance between the final ends and the specimen. Hitherto only much smaller areas, not more than ½ millimeter square can be scanned satisfactorily. The great importance of this is that the electron beam can be moved relative to the specimen, for example a microchip circuit specimen, by electromagnetic means only in order to measure voltages at different points quickly and with great accuracy.

A preferred, though not essential, feature of the voltage measuring electron collector is that it may be embodied by a self-contained structure which can be inserted into most scanning electron microscopes easily through a standard aperture in the chamber wall of the scanning electron microscope. In general, known systems are specific to a particular design of scanning electron microscope and require parts of the scanning electron microscope for their operation. However, it is not hereby intended to exclude structures which are not self-contained. It is feasible to make a voltage measuring electron collector in accordance with the invention in a retractable form which can be completely withdrawn from the path of the primary electron beam to a position which allows the ordinary scanning electron microscope's electron collector to be used in its place; thus when the voltage measuring electron collector is retracted, the specimen can be brought closer to the final lens so as to provide a more familiar type of scanning electron microscope image which is capable of better spatial resolution; it is preferable for the voltage measurement electron collector characteristic of the present invention to be optimised for voltage contrast (in an image mode) and voltage measurement (in waveform mode) at the expense of topographic contrast, spatial resolution and atomic number contrast. In particular the voltage measuring electron collector described hereinafter in detail is designed and optimised for, in order of priority, (1) the derivation of voltage waveforms from points on the specimen; (2) the derivation of such waveforms from a chosen sequence or set of points on the specimen surface by vectored placing of the electron beam at each test point in turn; and (3) the production of images with predictable voltage contrast. Other objects and features of the present invention will be more apparent from the following description of a preferred embodiment of the invention described for convenience in association with a sampling system of known form.

BRIEF DESCRIPTION OF THE DRAWINGS

FIG. 2 illustrates a secondary electron energy spectrum for a conducting material;

FIG. 3 illustrates part of an energy spectrum as in FIG. 2, showing the effect of a shift of Fermi level;

FIG. 4 illustrates the integral of the spectrum shown in FIG. 3;

Figure 1:
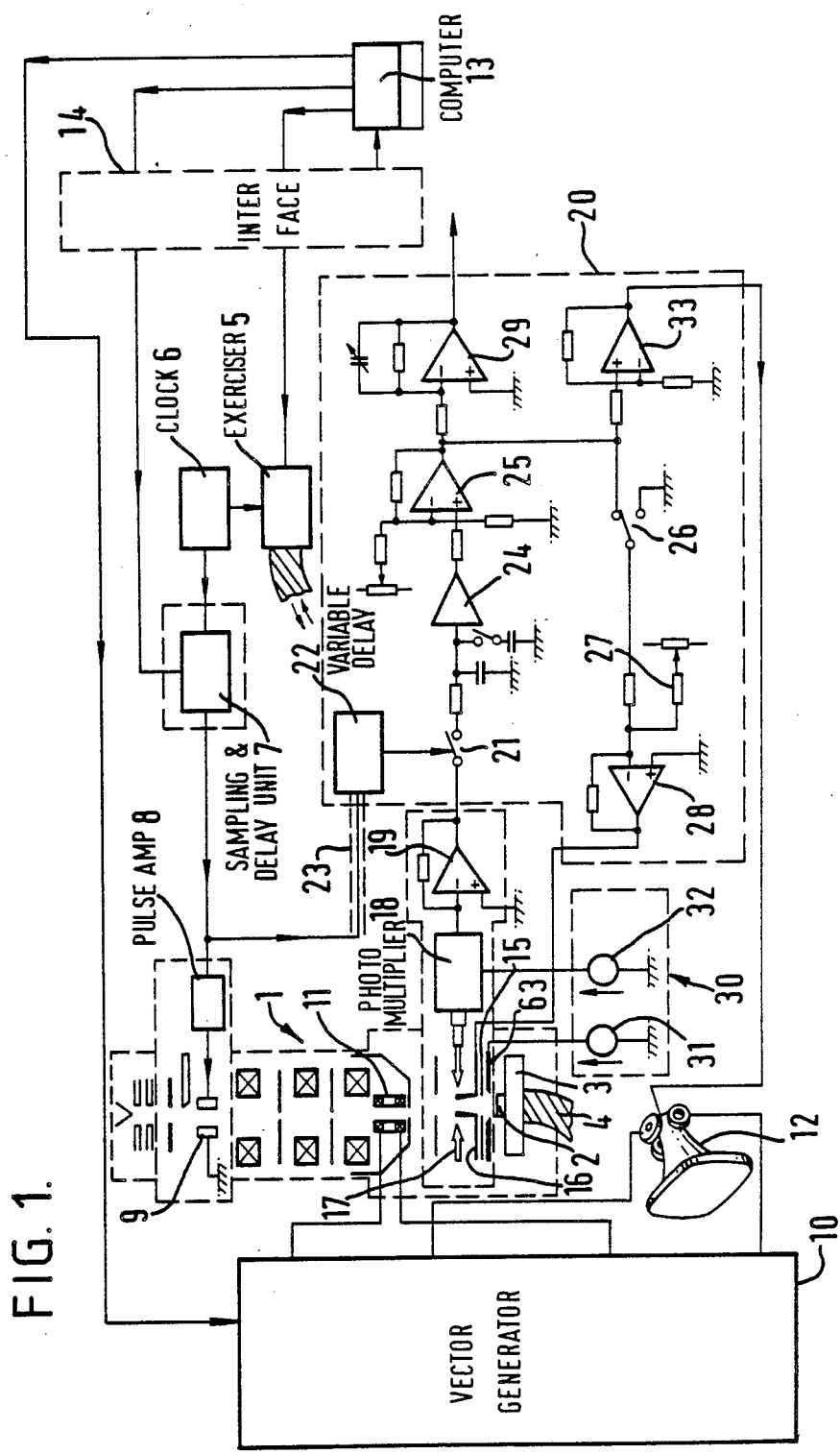
FIG. 1 is a schematic diagram of a complete system, shown simplified for purposes of explanation, including a scanning electron microscope, various associated control and processing units and a voltage measuring electron collector.

The system shown in FIG. 1 comprises a scanning electron microscope 1 between the final lens of which and the location of a specimen are the electrodes of a voltage measuring collector which is described in more detail with reference to FIGS. 6 and 7. The specimen 2 is mounted on a stage 3 within the chamber of the scanning electron microscope. The specimen is provided with power and functional inputs via connections 4 from an exerciser 5, to which functional outputs are provided by way of the connections 4 from the specimen 2. A clock 6 provides clock signals to the exerciser 5 and to a sampling and delay unit 7 which provides a drive pulse, of selectable duration, to a pulse amplifier 8 which feeds blanking plates 9 in the scanning electron microscope. The electron beam is pulsed on by deflection from a normally blank position to a position axially of the column of the electron microscope.

The electron beam is generated and focussed by well-known means not directly relevant to the present invention. Deflection currents may be provided from a vector generator 10 to scan coils 11 so as, when required in for example a vector image mode of operation, to convert selected coordinates to appropriate deflection coil currents which are fed together with corresponding scan currents to the scan coils to produce an imaging raster centred on the selected vector. The area of the specimen which is imaged on the cathode ray tube 12 for the scanning microscope may then be centred on the selected vector. In this way a test interconnect vector is located and can be stored in memory for later reaccessing. The vector can be set if desired by a control computer 13 via an interface 14. The exerciser 5 and the sampling and delay units 7 can also be controlled by the computer if desired.

An electron beam pulse arrives at the specimen in synchronism with the clock and generates a secondary electron puls. Secondaries are drawn into the voltage measuring electron collector by an extractor electrode 15. Only those electrons with sufficient energy are transmitted through an energy filter 16 (to be described in more detail later) and accelerated, for collection, on to a scintillator 17 which is preferably of special form described hereinafter.

Light generated at the scintillator proceeds along optical fibres and is converted to photoelectrons which are amplified by a photomultiplier 18 and a head amplifier 19 to give an amplified version of the collected secondary electron pulse. This pulse is fed to a processing circuit 20. This includes a boxcar gate 21 which is operated by a variable delay 22 triggered through a fixed delay 23 from the output of the sampling and delay unit 7. The boxcar gate provides boxcar averaging of the train of collected secondary electron pulses. The processing circuit includes a unity gain buffer amplifier 24 and a video amplifier 25. The voltage output of the amplifier 25 may, in closed loop operation, be summed, when a switch 26 is in its upper position, with a bias voltage provided from a bias circuit 27 and via an amplifier 28, fed back to the filter electrode 16 of the voltage measuring electron collector. The system output, which is obtained via an output filter 29, is proportional to the filter electrode voltage.

In what is known as the waveform mode, closed loop operation is usual. In what is known as an image mode, the closed loop is usually opened, by operation of the switch 26, to provide a monotonic, but not accurately linear, variation of output with the specimen voltage and also bandwidth sufficient for TV rate imaging. A circuit 30 includes a voltage source 31 to provide an appropriate potential for the extractor electrode 15 and a voltage source 32 to provide appropriate voltage for operation of the photomultiplier 18.

The output of the amplifier 25 is also fed through a further amplifier 33 to provide video signals for the cathode ray tube 12.

The foregoing description of FIG. 1 is not intended to be a complete description of an electron beam sampling or measuring system and is intended only to set the context for the voltage measuring electron collector of particular description herein. Except for such collector, the system shown in FIG. 1 is commercially available and its manner of operation is known to those skilled in the art.

In a scanning electron microscope the electron probe interacts with the specimen to produce secondary electrons. The generalised secondary electron energy spectrum for a conducting material is shown in FIG. 2. This shows numbers of electrons against energy level. This is a well-known spectrum of which the principal parts indicate the energies of low energy secondary electrons 40, Auger electrons 41, inelastically scattered electrons 42, plasma loss electrons 43 and, at the highest energy level, reflected electrons 44. The low energy secondary electrons and the Auger electrons originate from energy levels within the material and their energy distribution is fixed relative to the Fermi energy of the material. If the potential of the material, which is to say the Fermi level, is varied the energy distribution of the low energy secondaries and the Auger electrons will shift by the same amount. This shift is the basis for voltage contrast measurement. The reflected primaries inelastically scattered and plasma loss electrons carry no voltage contrast information and are usually supressed in order to obtain the best noise performance.

FIG. 3 shows the effect of a shift $\Delta V$ in the Fermi level and the consequential shift from the solid line 51 to the dashed line 52 in the energy distribution.

FIG. 4 shows in solid line 53 and dashed line 54, the difference between which is caused by a variation in the Fermi level of the material, the integral electron energy spectrum that is to say the integral $$\int_E^\infty N(E)dE$$

against E. This spectrum may also be used to obtain voltage contrast owing to the exhibition of a shift in the spectrum with Fermi level. The integral spectrum is more easily obtained in practice since only an energy filter rather than an analyser is required. Such a filter is the basis of the voltage measuring electron collector described herein.

Figure 5:
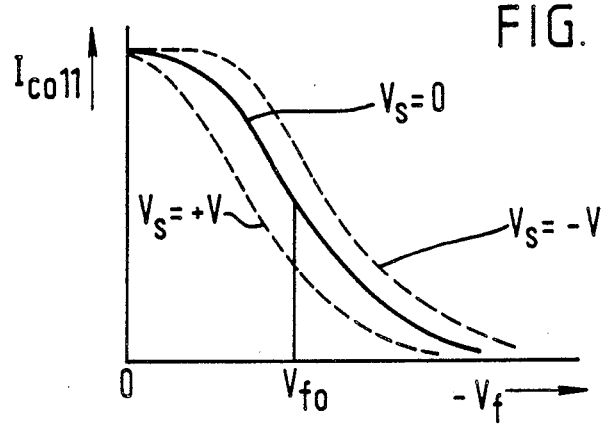
FIG. 5 shows variation of collected current as a function of filter voltage.

FIG. 5 shows collected current $I_{coll}$ as a function of the filter voltage $V_f$ for various values of the test specimen voltage $V_s$. This is the collector characteristic or S-curve which can be displayed (with the y axis inverted) in order that a suitable operating point for the filter voltage may be chosen. FIG. 5 shows that when $V_{fo}$ has been set correctly a change in the sample voltage $V_s$ results in a change in the collected current. This is the basis of both image and waveform modes of operation and is equally applicable in real time or stroboscopic use.

Figure 6:
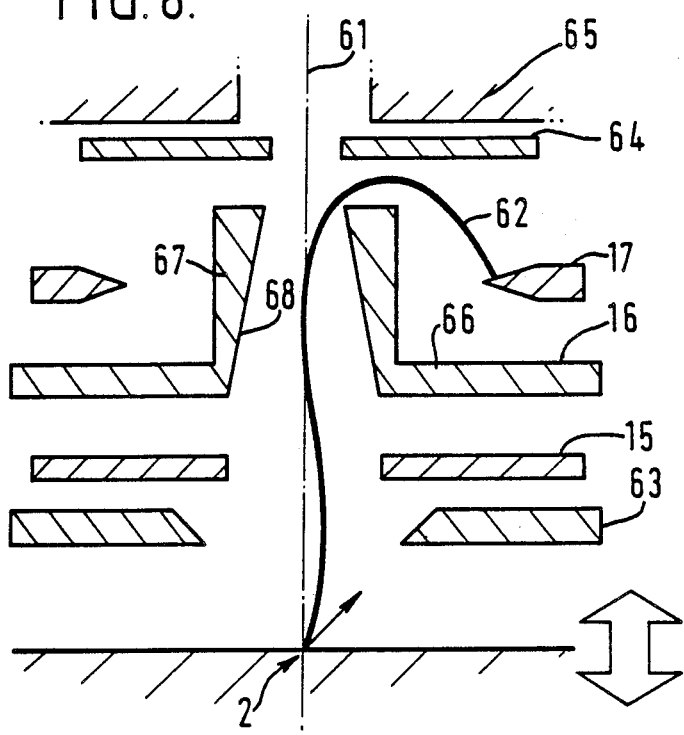
FIG. 6 illustrates a section through a preferred embodiment of a voltage measuring electron collector.

FIG. 6 illustrates the physical disposition, and the operation of, the electrodes of the preferred voltage measuring electron collector.

FIG. 6 diagrammatically illustrates an electron probe 61, constituted by a "primary" electron beam, impinging on the specimen 2. A typical path for the secondary electron emitted from the specimen in response to the impingement of the electron probe thereon is indicated by the path 62. In the illustrated embodiment, the voltage measuring electron collector is disposed between the specimen and the pole piece 65 of the final lens of the scanning electron microscope. The voltage measuring electron collector is cylindrically symmetrical about the longitudinal axis of the microscope and, as will be apparent, consists of a set of solid electrodes which have generally aligned central apertures for the untrammelled passage of the primary electron beam. The path 62 of a secondary electron which is to be collected passes through the central apertures of the electrodes with the exception of a mirror electrode 64.

It is preferable to position the electron collector as close as possible to the pole piece 65. The specimen 2, which may be a very large scale integrated circuit, is positioned below the electron collector at a position which may be selected either as convenient or for the purpose of optimising a particular parameter of operation, such as the magnitude of an extraction field or the uniformity of extraction fields over a large surface area of the specimen.

Secondary electrons are emitted from the specimen at various angles and with varyng energies. As is well-known, the primary electron beam is caused to scan the specimen in a controlled manner, which might or might not be a raster scan. The beam can impinge on the specimen over an area limited by the apertures of the electrodes of the electron collector. This area can now be greater than 4 millimeters square.

Fundamentally, the electrode assembly consists of a disposition of electrodes in different shapes, made from different materials and bearing different voltages, which act in combination with the surface of the specimen to make possible the measurement of voltage at each point of the specimen surface which the electron beam is caused to impinge by the processing and conversion to light of the secondary electrons which are emitted from the specimen point as a consequence of the impingement of the primary electron beam. By means of the scintillator the output light is reconverted to an electrical current and further amplified and processed so that one may obtain an output voltage which is a known and predictable function of the specimen voltage at the point of impingement of the beam on the specimen. The disposition of electrodes is preferably also such as to allow scanning of the beam over, or vector deflection of the beam within, areas on the specimen of several millimeters square, the relationship between specimen voltage and the system output voltage, though subject to slight variation, being maintained known and predictable within that area of the specimen. Various forms of electron collector have been devised but the present invention represents a combination of features which facilitates the maintenance of the relationship between the specimen voltage and system output voltage notwithstanding scanning of the beam over a comparatively large area.

The electrode assembly comprises an extractor electrode 15 which is maintained at, for example, 5 kilovolts positive relative to the specimen so that the extraction electrode 15 applies a strong electric field at the surface of the specimen. This field has a large component normal to the specimen and thus serves to extract the low energy secondary electrons emitted from the specimen surface even in the presence of surface electric fields, known as fringing fields, which would tend to retard them and return them to the specimen surface. Such fringing fields occur in many positions on the surface of typical integrated circuits in operation, that is to say having appropriate power and signal voltages applied thereto.

The assembly preferably includes a corrector electrode 63, disposed closer to the specimen than the extractor electrode and preferably maintained at substantially zero volts. This corrector electrode which may have a conical inner surface, serves to render the extraction field, applied by the extraction electrode 15, more unfiorm over an area of, for example, several millimeters square than the field otherwise would be. The purposes of this is to render the collector characteristic of S-curve, as described with reference to FIG. 5, more uniform in height and shape than it otherwise would be. However, if it is necessary to have an especially high extraction field on the specimen, at the expense of uniformity over the scan area, the corrector electrode may be omitted or removed. This is appropriate when for example, it is necessary to make accurate relative voltage measurement on the surface of an integrated circuit specimen where the dimensions of planar conductors and their separations are in the regin of one micrometer. Above the extractor electrode, that is to say further away from the specimen than the extractor electrode is the filter electrode 16 which comprises a solid plate 66 with a central aperture from which extends axially a cylindrical part 67 arranged coaxially with a common axis through the apertures of the other electrodes. The inner surface 68 of the part 67 is tapered. The wider end of the taper is of approximately the same diameter as the central aperture of the extractor electrode 15. The half angle of the taper may be of the order of $9\frac{1}{2}°$. Preferably the internal axial length of the filter is greater than the greatest internal diameter thereof.

Above the filter electrode is a solid "mirror" or reflective electrode 64. This electrode has a central aperture which is the smallest of the central apertures of the electrodes in the collector. In practice the diameter of the central aperture of the electrode 64 is about one third that of the diameter of the central aperture of the corrector electrode 63. The mirror electrode is maintained at a steady voltage which is negative with respect to that of the filter electrode; preferably the voltage difference is between about $-4$ and $-9$ volts. There is an annular gap between the top of the cylindrical part 67 of the filter electrode and the mirror electrode 64. This annular gap forms an entrance to a somewhat larger space bounded by the planar parts of the filter electrode and the mirror electrode. One effect of the mirror electrode, in combination with a cylindrical central passageway of the filter electrode is to cause the secondary electrodes to pass into the annular space between the mirror electrode and the filter electrode, the electrons being thereby deviated in an approximately radial direction.

The mirror electrode need not be in planar form as described; in particular it could be frusto-conical, the vertex pointing towards the specimen.

As well as acting in combination with the filter electrode, the mirror electrode also acts to prevent the entry into the larger annular space defined between the mirror electrode and the filter electrode of secondary electrons which, as a result of impingement of electrons back scattered from the specimen, are emitted from the bore of the pole piece 65 of the objective lens of the scanning electron microscope.

The filter electrode and the mirror electrode function in combination to produce equipotentials which are negative relative to the specimen and of appropriate three dimensional shape to produce two effects. One is to cause secondary electrons which are emitted with perpendicular velocity below a certain threshold value to turn around before they reach the top of the taper in the filter electrode and to travel back towards the specimen 2. These electrons are usually attracted to and collected by the highly positive extractor electrode 15. The second effect is to cause the transmission of secondary electrons emitted with perpendicular velocity above that same threshold beyond the top of the taper and then, as mentioned hitherto, to be accelerated radially into the annular space between the outside surface of the filter electrode, the bottom surface of the mirror electrode and the scintillator 17. For this purpose the filter electrode and the mirror electrode have in combination two primary actions. The first action is to set up a relationship between the number of electrons which reach the annular space aforementioned and the potential energy, that is to say the voltage of their point of origin of the specimen. The perpendicular component of velocity of any electron which enters the tapered region of the filter electrode is the sum of its kinetic energy of emission at the specimen and the potential energy (voltage) of that region of the specimen from which it is emitted. The other action of the combination of the filter electrode and the mirror electrode is to inhibit two other groups of electrons from reaching the aforementioned annular space defined between the mirror electrode, the filter electrode and the scintillator. One group is the high energy back scattered electrons (as mentioned with reference to FIG. 2) and the second group of electrons is the further secondaries generated by these high energy back scattered electrons from surfaces other than the specimen. This latter group of electrons is commonly known as tertiary electrons. The filter electrode also prevents the voltage which appears on the scintillator from affecting the trajectories of the electrons in the primary electron beam before these electrons strike the specimen. The filter electrode prevents the same high voltage from affecting the trajectories of the secondary electrons emitted from the specimen until those electrons enter the annular space defined between the mirror electrode, the filter electrode and the scintillator.

The scintillator 17 may be an annulus of which the inner surface tapers to an annular edge. The scintillator, which may be homogeneous throughout, or may be made by coating a transparent material such as "perspex", glass or quartz, fashioned in the shape shown, with a relatively thin coating of a scintillator or phosphor material, is provided with a further thin coating of aluminium or other suitable electrically conducting material. The thickness of the coating is such as to permit the penetration of electrons accelerated by the voltage on the coating (typically about 10 kilovolts) to penetrate through the coating to produce efficiently light in the scintillator or phosphor material. The coating must however be thick enough to ensure that it be electrically continuous and also be able to act as a mirror to prevent the light which is generated by incident electrons from emerging through the coating.

The shape of the scintillator (or phosphor electrode) 17, is designed to reflect light generated in the material of the scintillator (or phosphor material) towards the back surface, that is to say the right cylindrical surface of the electrode 17.

Figure 7:
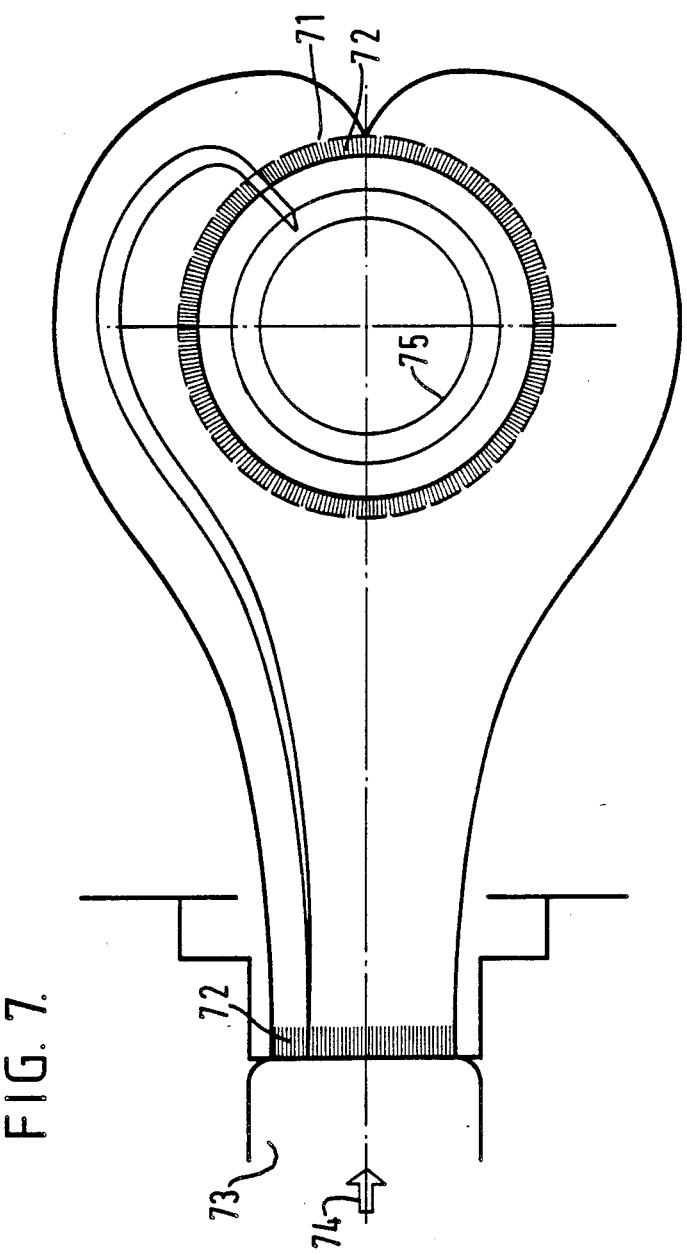
FIG. 7 illustrates the transmission path from a scintillator to a photomultiplier in the preferred embodiment of the voltage measuring electron collector.

To the radially outer surface of the scintillator, as shown in FIG. 7, is connected a multiplicity of optical fibres 71. The ends 72 of the fibres make a good optical contact with the scintillator. The optical fibres are provided for all the circumference of the scintillator but are all brought together at their opposite ends 72 to feed a common photomultiplier (shown as 73 in FIG. 7), being preferably in intimate contact with the glass end face which bears a photo cathode on the inner surface thereof. The photomultiplier is preferably urged by a spring in the direction of the arrow 74 in order to ensure the intimate contact of the optical fibres with the glass end face of the photomultiplier.

Thus the collection of optical fibres is arranged at the ends 72 as a close right cylindrical surface of the same axial length as the height of the electrode 17 and is configured at the photomultiplier end as a flat circular surface, the quadrants of the right cylindrical surface corresponding to the quadrants of the circular surface at the other end. The effect of the arrangement is to ensure that secondary electrons which are emitted from the specimen and which succeed in overcoming the velocity filter and which finally reach the electrode 17 in a given quadrant thereof all give rise to light arising at the corresponding quadrant of the flat circular interface between the optical fibres and the photomultiplier.

One important feature of the described voltage measuring electron collector is therefore the use of a solid mirror electrode rather than a mesh. Another important feature is the use of a filter electrode having a tapered, axially extending part. The combination of these two features also has the advantage that they provide an effective energy filter for low energy secondary electrons only, it being possible as a result of the described structure to avoid the collection of higher energy secondaries. Moreover, the aforementioned combination make the mirror electrode very efficient for directing the transmitted electrons to the scintillator. The tapered cylindrical part of the filter electrode shields the secondary electrons from the effect of the mirror electrode and the scintillator or phosphor electrode and the tapering of the filter electrode makes the shielding more effective than that which would be provided by an ordinary right-circular cylindrical passageway through the filter electrode. The field due to the mirror electrode begins to take effect slgihtly before the secondary electrons emerge from the upper port of the filter electrode.

A further important feature of the arrangement is the use of an inwardly tapering annular scintillator which has a conductive coating permitting the entry of electrons but constituting a mirror arranged to direct light generated by those electrons radially outwardly. Such a scintillator has independent utility.

It will be understood that the invention may be used when a probe cord is disposed between the voltage measuring collector and the specimen.

I claim:

1. Voltage measuring electron collector characterised by the combination of a filter electrode and a mirror electrode in solid form and having substantially aligned central apertures and characterised in that the filter electrode has a tubular part extending axially of, and defining the central aperture of the filter electrode, the said electrodes being operable to direct electrons that proceed through the filter electrode in the direction of the mirror electrode to a region outside the tubular part and partially bounded by said electrodes.

2. A voltage measuring electron collector according to claim 1 in which the mirror electrode is in planar form.

3. A voltage measuring electron collector according to claim 1 in which the said tubular part has an internal tapered or conical surface.

4. A voltage measuring electron collector according to claim 1 characterised by an annular electro-optical electrode disposed in said region and encircling the tubular part.

5. A voltage measuring electron collector according to claim 4 in which the annular electro-optical electrode has a conductive surface coating premitting electrons to enter the electrode yet constituting a mirror disposed to reflect radially outwardly light generated within the electrode by said electrons.

6. A voltage measuring electron collector according to claim 1, characterised by an extractor electrode in solid plate form with a central aperture aligned with the aformentioned apertures.

7. A voltage measuring electron collector according to claim 6, characterised by a corrector electrode of solid plate form with a central aperture aligned with the aformentioned apertures, the corrector electrode being positioned for disposition closer to a specimen than the extractor electrode and being capable of rendering more uniform an electric field produced by the extractor electrode.

8. A voltage measuring electron collector characterised by a filter electrode which has for the passage of electrons a principal aperture defined by an internally tapered tubular part.

9. In a voltage measuring collector, the improvement which comprises:
an annular scintillator having a tapered inner surface, and a radially extending outer surface;
means coupled around the outer surface of the scintillator for the collection of light therefrom; and
a conductive coating for said scintillator, said conductive coating extending over at least said tapered inner surface to permit the passage of electrons therethrough and constituting a mirror to reflect light generated within the scintillator towards said outer surface.

10. The improvement as set forth in claim 9 wherein the means for transmitting light from said outer surface comprises a multiplicity of optical fibres having input ends adjacent said outer surface.

11. The improvement set forth in claim 10, further comprising a common photomultiplier coupled to output ends of all said optical fibres.

12. A voltage measuring electron collector comprising:
electrode means for the reception of electrons, said electrode means defining an annular space as a destination for said electrons and including filter means for allowing relatively low energy electrons to reach said annular space and inhibiting relatively high energy electrons from reaching said space;
an annular scintillator having an inner surface and an outer surface radially spaced from said inner surface, said inner surface being covered by a conductive coating which permits the passage of electrons and constitutes a mirror for light generated within the scintillator in response to the reception of electrons by said scintillator; and
means coupled entirely around said outer surface of the scintillator to provide transmission of light therefrom.

* * * * *